(12) United States Patent
Wang et al.

(10) Patent No.: US 6,617,639 B1
(45) Date of Patent: Sep. 9, 2003

(54) USE OF HIGH-K DIELECTRIC MATERIAL FOR ONO AND TUNNEL OXIDE TO IMPROVE FLOATING GATE FLASH MEMORY COUPLING

(75) Inventors: Zhigang Wang, San Jose, CA (US); Xin Guo, Mountain View, CA (US); Yue-Song He, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/176,594

(22) Filed: Jun. 21, 2002

(51) Int. Cl.⁷ .......................................... H01L 29/788
(52) U.S. Cl. ..................................... 257/324; 257/315
(58) Field of Search ............................ 257/315, 324; 438/201

(56) References Cited

U.S. PATENT DOCUMENTS

| | | | |
|---|---|---|---|
| 5,120,672 A | 6/1992 | Mitchell et al. ............... 437/43 |
| 6,008,091 A | 12/1999 | Gregor et al. ............... 438/261 |
| 6,013,553 A | 1/2000 | Wallace et al. ............. 438/287 |
| 6,163,049 A | 12/2000 | Bui ............................ 257/321 |
| 6,171,900 B1 | 1/2001 | Sun ............................ 438/240 |
| 6,242,306 B1 | 6/2001 | Pham et al. ................ 438/262 |
| 6,309,927 B1 * | 10/2001 | Au et al. ..................... 438/261 |
| 6,438,030 B1 * | 8/2002 | Hu et al. ................. 365/185.18 |
| 6,461,905 B1 * | 10/2002 | Wang et al. ................. 438/183 |
| 2002/0106536 A1 | 8/2002 | Lee et al. .................... 428/702 |
| 2002/0115252 A1 | 8/2002 | Haukka et al. ............. 438/240 |
| 2002/0142624 A1 | 10/2002 | Levy et al. ................. 438/786 |
| 2002/0190311 A1 * | 12/2002 | Blomme et al. ............ 257/321 |

* cited by examiner

Primary Examiner—Allan R. Wilson
(74) Attorney, Agent, or Firm—Renner, Otto, Boisselle & Sklar, LLP (57) ABSTRACT

A floating gate flash memory device including a substrate comprising a source region, a drain region, and a channel region positioned therebetween; a floating gate electrode positioned above the channel region and separated from the channel region by a tunnel dielectric material layer; and a control gate electrode positioned above the floating gate electrode and separated from the floating gate electrode by an interpoly dielectric layer, the interpoly dielectric layer comprising a modified ONO structure having a bottom dielectric material layer adjacent to the floating gate electrode, a top dielectric material layer adjacent to the control gate electrode, and a center layer comprising a nitride and positioned between the bottom dielectric material layer and the top dielectric material layer, in which the tunnel dielectric material layer, and at least one of the bottom dielectric material layer and the top dielectric material layer, comprise a high-K dielectric material.

20 Claims, 4 Drawing Sheets

USE OF HIGH-K DIELECTRIC MATERIAL FOR ONO AND TUNNEL OXIDE TO IMPROVE FLOATING GATE FLASH MEMORY COUPLING

TECHNICAL FIELD

The present invention relates to a structure and a process for fabrication of a semiconductor device including a high-K dielectric material for a tunnel dielectric and in a modified ONO structure, in particular to a structure and process for fabrication of a floating gate flash memory device.

BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, flash EEPROM devices enable the erasing of all memory cells in the device using a single electrical current pulse.

Product development efforts in EEPROM device technology have focused on increasing the programming speed, lowering programming and reading voltages, increasing data retention time, reducing cell erasure times and reducing cell dimensions.

An important dielectric material for the fabrication of the EEPROM is an oxide-nitride-oxide (ONO) structure. The ONO structure has been used as the interpoly dielectric layer in a floating gate flash memory device. In such a device, the ONO structure separates the floating gate electrode from the control gate electrode.

A floating gate flash memory device includes a floating gate electrode upon which electrical charge is stored. The floating gate electrode is formed on a tunnel oxide layer which overlies a channel region residing between the source and drain regions in a semiconductor substrate. The floating gate electrode together with the source and drain regions form an enhancement transistor. Typically, the floating gate electrode may be formed of polysilicon.

In a floating gate flash memory device, electrons are transferred to the floating gate electrode through a dielectric layer overlying the channel region of the enhancement transistor. The electron transfer is initiated by either hot electron injection, or by Fowler-Nordheim tunneling. In either electron transfer mechanism, a voltage potential is applied to the floating gate electrode by an overlying control gate electrode. The control gate electrode is capacitively coupled to the floating gate electrode, such that a voltage applied on the control gate electrode is coupled to the floating gate electrode through a dielectric layer, which is often referred to as the interpoly dielectric. The floating gate flash memory device is programmed by applying a high positive voltage to the control gate electrode, and a lower positive voltage to the drain region, which transfers electrons from the channel region to the floating gate electrode. The control gate electrode is separated from the floating gate electrode by the interpoly dielectric layer which, as noted above, may be an ONO structure or layer. However, as device dimensions continue to be reduced, the electrical thickness of the interpoly dielectric layer between the control gate electrode and the floating gate electrode need to be reduced accordingly. Previously, this has been accomplished by scaling down the physical thickness of the ONO layer. However, as the ONO layer is made physically thinner, leakage current through the ONO layer may increase, which limits the scaling down of the total physical thickness of the ONO layer.

Some of the improvements in devices can be addressed through development of materials and processes for fabricating the ONO layer. Recently, development efforts have focused on novel processes and materials for use in fabrication of dielectric materials, such as for use in the ONO layer. Numerous challenges remain in the fabrication of material layers within these devices. In particular, the ONO layer must be carefully fabricated to avoid an increase in the leakage current, while obtaining an electrically thin layer. Accordingly, advances in ONO fabrication and materials technology are needed to ensure proper charge isolation in ONO structures in floating gate flash memory devices.

DISCLOSURE OF INVENTION

In one embodiment, the present invention relates to a floating gate flash memory device including a) a substrate comprising a source region, a drain region, and a channel region positioned therebetween; b) a floating gate electrode positioned above the channel region and separated from the channel region by a tunnel dielectric material layer; and c) a control gate electrode positioned above the floating gate electrode and separated from the floating gate electrode by an interpoly dielectric layer, the interpoly dielectric layer comprising a modified ONO structure having a bottom dielectric material layer adjacent to the floating gate electrode, a top dielectric material layer adjacent to the control gate electrode, and a center layer comprising a nitride and positioned between the bottom dielectric material layer and the top dielectric material layer, in which the tunnel dielectric material layer, and at least one of the bottom dielectric material layer and the top dielectric material layer, comprise a high-K dielectric material.

In another embodiment, the present invention relates to a floating gate flash memory device including a) a substrate comprising a source region, a drain region, and a channel region positioned therebetween; b) a floating gate electrode positioned above the channel region and separated from the channel region by a tunnel dielectric material layer; and c) a control gate electrode positioned above the floating gate electrode and separated from the floating gate electrode by an interpoly dielectric layer, the interpoly dielectric layer comprising a modified ONO structure having a bottom dielectric material layer adjacent to the floating gate electrode, a top dielectric material layer adjacent to the control gate electrode, and a center layer comprising a nitride and positioned between the bottom dielectric material layer and the top dielectric material layer, wherein each of the tunnel dielectric material layer, the bottom dielectric material layer and the top dielectric material layer comprises a high-K dielectric material.

In one embodiment, the present invention relates to a process for fabrication of a floating gate flash memory device by steps including providing a semiconductor substrate; forming a tunnel dielectric layer overlying the substrate; forming a floating gate electrode overlying the tunnel dielectric layer; forming a bottom dielectric material layer overlying the floating gate electrode; depositing a nitride layer overlying the tunnel dielectric material layer; and depositing a top dielectric material layer overlying the nitride layer, wherein each of the tunnel dielectric material layer, the bottom dielectric material layer and the top dielectric material layer comprise a high-K dielectric material.

Thus, in the present invention, by use of a high-K dielectric material instead of silicon dioxide for the tunnel oxide layer, and at least one of the bottom oxide layer and the top oxide layer, a floating gate flash memory device may be fabricated having reduced dimensions without creation of interface states coming from contamination which could provide charge leakage paths within the modified ONO structure in the device. The present invention provides advantages such as (1) improved coupling between the control gate electrode and the floating gate electrode; (2) reduction of equivalent oxide thickness of the ONO structure; (3) improved data retention and reliability; and (4) the high-K dielectric material layer replacing the silicon dioxide layers allows fabrication of an ONO layer and a tunnel dielectric layer which are physically thicker, resulting in fewer charge leakage paths within these dielectric material layers. A variety of high-K or composite dielectric materials may be used for replacement of silicon dioxide in the in the tunnel dielectric layer and in the bottom and top oxide layers of a modified ONO structure. These dielectric materials may be formed in a nano-laminate, allowing for exact selection of composition, thickness and K value of the dielectric material layers. Thus, the present invention provides an advance in dielectric material layer fabrication technology for floating gate flash memory devices, and ensures proper dielectric separation of the control gate electrode from the floating gate electrode, and proper dielectric separation of the floating gate electrode from the channel, source and drain, while at the same time providing distinct process and economic advantages.

Although described herein in terms of a floating gate flash memory device, the present invention is broadly applicable to fabrication of any semiconductor device that includes an ONO structure and additional dielectric layers in which the equivalent oxide thickness needs to be reduced, while maintaining a physically thick dielectric material layer.

It should be appreciated that for simplicity and clarity of illustration, elements shown in the figures have not necessarily been drawn to scale. For example, the dimensions of some of the elements are exaggerated relative to each other for clarity. Further, where considered appropriate, reference numerals have been repeated among the figures to indicate corresponding elements.

MODES FOR CARRYING OUT THE INVENTION

Figure 1:
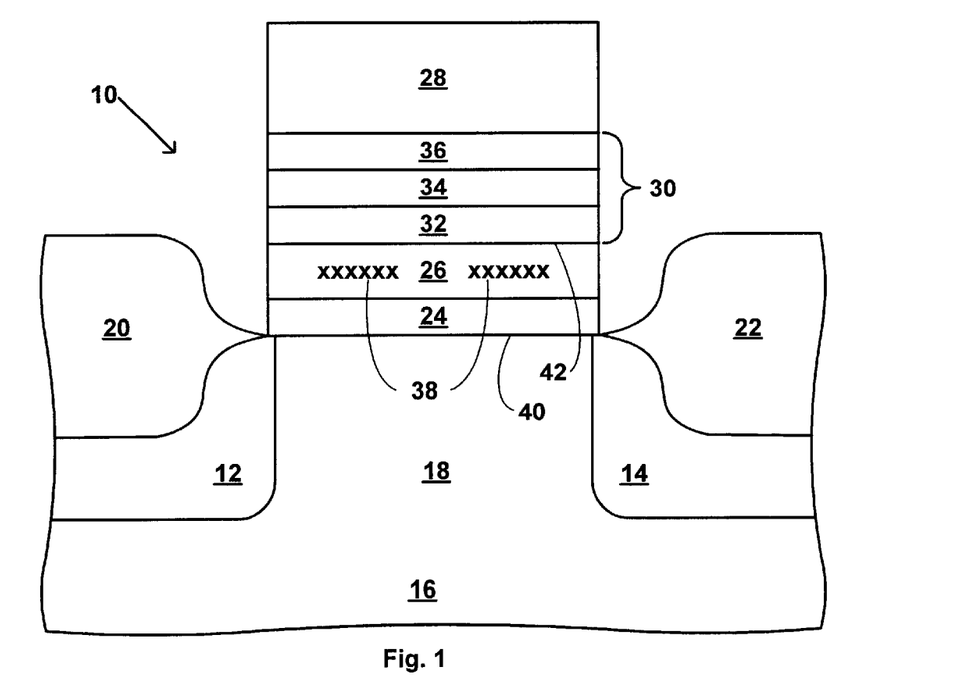
FIG. 1 schematically illustrates, in cross-section, a portion of a semiconductor device containing a floating gate flash memory cell which incorporates a tunnel dielectric material layer and a modified ONO structure, fabricated in accordance with the invention.

Referring first to FIG. 1, there is schematically shown in cross-section a floating gate flash memory device or cell 10 suitable for use in a floating gate flash EEPROM device. The cell 10 includes source/drain regions 12 and 14 located in a semiconductor substrate 16 and separated by a channel region 18. First and second bit line oxide regions 20 and 22 overlie source/drain regions 12 and 14, respectively. A tunnel dielectric material layer 24 overlies the channel region 18. A floating gate electrode 26 overlies the tunnel dielectric material layer 24. In one embodiment, the tunnel dielectric material layer 24 comprises a high-K dielectric material. In another embodiment, the tunnel dielectric material layer 24 is a composite dielectric material, comprising a mixture of a standard-K dielectric material, such as silicon dioxide, silicon nitride, silicon oxynitride or aluminum oxide, with a high-K dielectric material, such as, for example, hafnium oxide or zirconium oxide.

Referring still to FIG. 1, the floating gate electrode 26 is separated from a control gate electrode 28 by an interpoly dielectric layer which comprises a modified ONO structure 30. The modified ONO structure 30 comprises a bottom dielectric material layer 32, a nitride layer 34, and a top dielectric material layer 36. The control gate electrode 28, the modified ONO structure 30 and the floating gate electrode 26 form a floating gate flash memory cell structure. The modified ONO structure shown in FIG. 1 includes a high-K dielectric material in at least one of the top dielectric material layer 36 and the bottom dielectric material layer 32, in which at least one high-K dielectric material replaces, is added to, or is combined with, the conventional silicon dioxide. Thus, the ONO structure 30 is referred to as a "modified ONO structure" herein because at least one of the conventional silicon dioxide layers (the "O's" of "ONO") is replaced by a high-K or composite dielectric material.

It should also be noted that the floating-gate flash memory cell 10 of the present invention is a symmetrical device. Therefore, the use of the terms "source" and "drain," as they are commonly used with conventional transistor devices, may be confusing. For example, each dual floating-gate flash memory cell 10 comprises a pair of adjacent source/drain regions 12, 14. During program, erase and read functions, one of these two source/drain regions 12/14 will serve as a source, while the other will serve as a drain. In conventional transistor terminology, electrons travel from the source to the drain. Which source/drain region 12/14 functions as a source, and which serves as a drain, depends on the function being performed and on the floating-gate 24 being addressed (i.e., programmed, erased or read). Thus, it is to be understood that references to source or drain may refer to different structures at different times.

As used herein, the term "standard-K dielectric material" refers to a dielectric material having a K up to about 10. Such standard-K dielectric materials include, for example, silicon dioxide, which has a K of about 4, silicon oxynitride, which has a K of about 4–8 depending on the relative content of oxygen and nitrogen, and silicon nitride, which has a K of about 6–9, and aluminum oxide, which has a K of about 10.

As used herein, the term "high-K dielectric material" refers to a dielectric material having a K of about 10 or more. Such high-K dielectric materials include, for example, $HfO_2$, $ZrO_2$ and others, some of which are identified more fully below. In general, the term "high-K dielectric material" encompasses binary, ternary and higher oxides and any ferroelectric material having a K of about 20 or more. In addition, the high-K dielectric materials include, for example, composite materials such as hafnium silicate, which has a K of about 14, and hafnium silicon oxynitride, which has a K of about 16, depending on the relative content of oxygen and nitrogen, and hafnium silicon nitride, which has a K of about 18.

As used herein, the term "composite dielectric material" refers to a dielectric material comprising the elements of at least two other dielectric materials. A composite dielectric material generally has a K value greater than 10, as defined above for a high-K dielectric material. A composite dielectric material may be, for example, a mixed-metal oxide, a metal silicate, a metal aluminate or a metal mixed-aluminate/silicate. Thus, for example, using hafnium as the exemplary metal, the composite dielectric material may be hafnium-zirconium oxide ($Hf_xZr_{1-x}O_2$, where x ranges between 0 and 1), hafnium silicate ($HfSiO_4$), hafnium aluminate ($HfAl_2O_5$) or a hafnium mixed-aluminate/silicate, $HfO_2/SiO_2/Al_2O_3$, which may have a formula such as $Hf_2Si_2Al_2O_{11}$. As described in more detail below, a composite dielectric material may be formed by co-deposition of its component elements, or by sequential deposition followed by a treatment step, e.g., thermal treatment, to combine the elements to form the composite dielectric material. Suitable metals for the mixed-metal oxide, metal silicate, metal aluminate or metal mixed-aluminate/silicate include, for example, hafnium, zirconium, yttrium, cerium, tantalum, titanium, lanthanum, tungsten, bismuth, barium, strontium, scandium, niobium or lead, or mixtures thereof. Other metal oxides which, when combined with another metal oxide, silicon dioxide or aluminum oxide, or a mixture thereof, yield a material having a K value greater than about 10 may be suitable. In one embodiment, the mixed-metal oxide, metal silicate, metal aluminate or metal mixed-aluminate/ silicate is one which substantially does not react with silicon (or polysilicon or polysilicon-germanium) at temperatures of about 600–800° C.

As used herein, the term "polysilicon-germanium" refers to a mixture of polysilicon and germanium, in which the germanium content varies from slightly more than zero up to about 60% by weight by the mixture. Thus, the amount of germanium may range from a doping amount up to about 60% by weight, of the mixture. The polysilicon-germanium may be formed by any method known in the art, i.e., by doping polysilicon with germanium, or by co-deposition, for example.

Regarding dielectric constants, or K values, silicon dioxide (sometimes simply referred to as "oxide") has a K value of approximately 4, while other dielectric materials have higher K values. Silicon nitride ("nitride"), for example, has a K of about 6 to 9 (depending on formation conditions). Higher K values of, for example, 20 or more can be obtained with various transition metal oxides including hafnium oxide ($HfO_2$), zirconium oxide, ($ZrO_2$), tantalum oxide ($Ta_2O_5$), barium strontium titanate ("BST"), lead zirconate titanate ("PZT"), and others described more fully below. As shown in the table, some materials may have very high K values.

Using a high-K dielectric material for full or partial replacement of the silicon dioxide conventionally used for the tunnel dielectric layer 24, the top dielectric material layer 36 and/or the bottom dielectric material layer 32 allows a low electrical thickness to be achieved even with a physically thick layer. For example, a high-K dielectric material gate dielectric with a K of 40 and a thickness of 100 angstroms is substantially electrically equivalent to a silicon dioxide gate dielectric (K about 4) having a thickness of about 10 angstroms. The electrically equivalent thickness of high-K materials may be referred to in terms of the equivalent oxide thickness. Thus, the high-K dielectric material gate dielectric with a K of 40 having a given physical thickness has an equivalent oxide thickness which is approximately 1/10 the given physical thickness. For higher-K dielectric materials, thicker gate dielectric layers can be formed while maintaining equivalent oxide thickness values lower than are possible with very thin oxide layers. In this way, the reliability problems associated with very thin dielectric layers may be avoided while transistor performance is increased.

Approximate K-values or, in some cases, a range of K-values, are shown below in Table 1 for several exemplary dielectric materials. It is understood that the present invention is not limited to the specific dielectric materials disclosed herein, but may include any appropriate standard-K, mid-K, high-K and composite dielectric materials which are known and are compatible with the remaining elements of the semiconductor device with which the dielectric materials are to be used.

TABLE 1

| Dielectric Material | Approximate Dielectric Constant (K) (Relative Permittivity) |
|---|---|
| silicon dioxide | 4 |
| silicon nitride | 6–9 |
| silicon oxynitride | 4–8 |
| aluminum oxide | 10 |
| zirconium silicate | 12 |
| hafnium silicate | 15 |
| lanthanum oxide, $La_2O_3$ | 20–30 |
| hafnium oxide, $HfO_2$ | 20 |
| zirconium oxide, $ZrO_2$ | 25 |
| cerium oxide, $CeO_2$ | 26 |
| bismuth silicon oxide, $Bi_4Si_2O_{12}$ | 35–75 |
| titanium dioxide, $TiO_2$ | 30 |
| tantalum oxide, $Ta_2O_5$ | 26 |
| tungsten oxide, $WO_3$ | 42 |
| yttrium oxide, $Y_2O_3$ | 20 |
| $LaAlO_3$ | 25 |
| BST ($Ba_{1-x}Sr_xTiO_3$) | ~20—200 |
| $PbTiO_3$ | ~20—200 |
| $BaTiO_3$ | ~20—200 |
| $SrTiO_3$ | ~20—200 |
| $PbZrO_3$ | ~20—200 |
| PST ($PbSc_xTa_{1-x}O_3$) | ~200—3000 |
| PZN ($PbZn_xNb_{1-x}O_3$) | ~200—5000 |
| PZT ($PbZr_xTi_{1-x}O_3$) | ~100—1000 |
| PMN ($PbMg_xNb_{1-x}O_3$) | ~200—5000 |

It is noted that the K-values, or relative permittivity, for both standard-K and high-K dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, hafnium oxide, when stoichiometrically exact, has the chemical formula $HfO_2$. As used herein, the term "hafnium oxide" may include variants of stoichiometric $HfO_2$, which may be referred to as $Hf_xO_y$, in which either of x or y vary by a small amount. For example, in one embodiment, x may vary from about 0.75 to about 1.5, and y may vary from about 1.5 to about 3. In another embodiment, x may vary from about 0.9 to about 1.2, and y may vary from about 1.8 to about 2.2. Such variations from the exact stoichiometric formula fall within the definition of hafnium oxide. Similar variations from exact stoichiometry are included when the chemical formula for a compound is used. For example, again using hafnium oxide as an example, when the formula $HfO_2$ is used, $Hf_xO_y$ as defined above, is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Here and in all numerical values in the specification and claims, the limits of the ranges and ratios may be combined.

The following description of the devices and processes of the present invention are given in the context of a tunnel dielectric layer and a modified ONO structure suitable for use in a floating gate flash memory device. It is to be understood that, while the present invention is discussed herein in that context, that this is merely exemplary and is not intended to limit the scope of the present invention. The modified ONO structure fabricated by the presently disclosed method is applicable to any semiconductor device in which an ONO structure may be included, and in such a device including a tunnel dielectric layer. The invention is particularly applicable also to the floating gate flash memory device described above with reference to FIG. 1.

Referring to FIG. 1, in operation of the floating gate flash memory cell or device 10, electrons are transferred to the floating gate electrode 26 through the tunnel dielectric material layer 24, when the control gate electrode 28 is appropriately coupled to the floating gate electrode 26 via the modified ONO structure interpoly dielectric layer 30, from the channel region 18 of the device 10. A voltage potential is applied to the floating gate electrode 26 by the overlying control gate electrode 28, which is capacitively coupled to the floating gate electrode 26 through the intervening modified ONO structure 30. The floating gate flash memory device 10 is programmed by applying a high positive voltage to the control gate electrode 28 and a lower positive voltage to the drain region 14, which transfers electrons from the channel region 18 to the floating gate electrode 26. The electrons are stored as a charge 38 in the floating gate electrode 26, as shown in FIG. 1.

It will be recognized that for proper operation of the floating gate flash memory device 10, the modified ONO structure interpoly dielectric layer 30 must provide effective dielectric separation but still allow effective coupling between the control gate electrode 28 and the floating gate electrode 26.

In accordance with the present invention, charge leakage within the modified ONO structure 30 is minimized by forming a physically thick modified ONO structure 30 in which at least one of the top dielectric material layer 36 and the bottom dielectric material layer 32, and in one embodiment, both layers 36 and 32, comprise a high-K dielectric material, whereby the modified ONO structure 30 has a low equivalent oxide thickness. In addition, charge leakage between the floating gate electrode and the underlying structures is reduced by providing a physically thick tunnel dielectric layer 24 comprising a high-K dielectric material, which has a low equivalent oxide thickness. The reduced charge leakage and improved floating gate flash memory device performance obtained by the present invention can be better understood following a description of a fabrication process for the floating gate flash memory device carried out in accordance with the invention.

Figure 6:
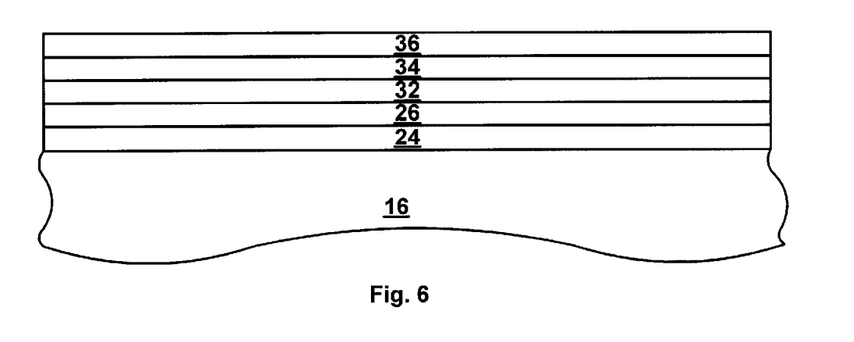
Figure 7:
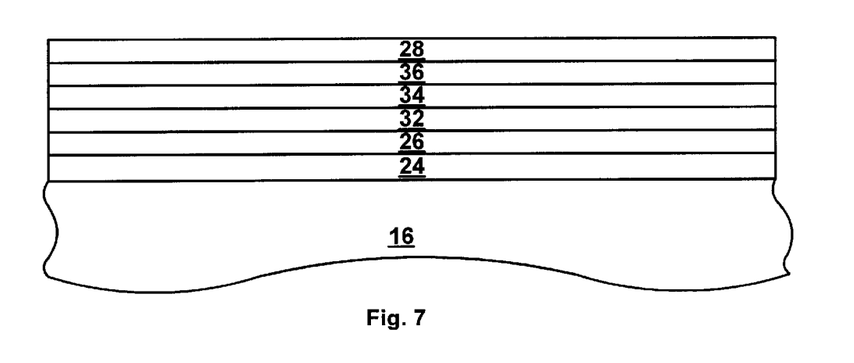
Figure 8:
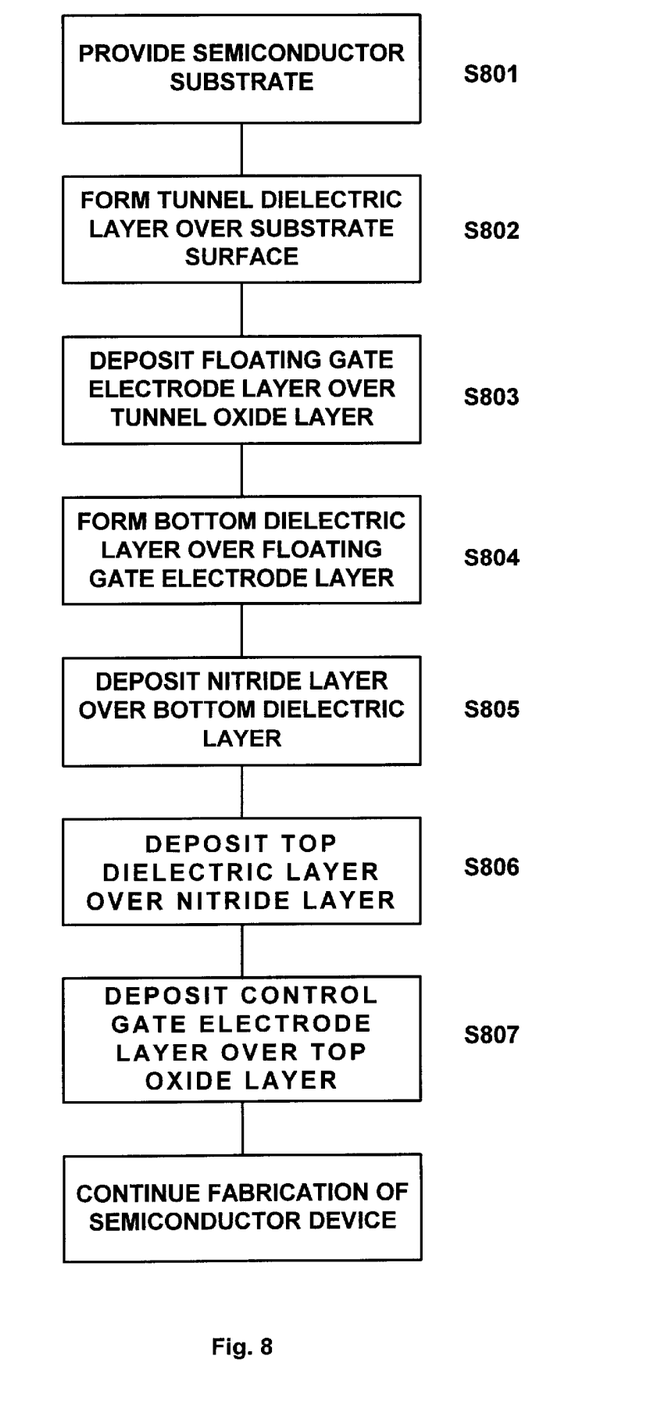
FIG. 8 is a schematic flow diagram showing the steps of the present invention.

A description of a method of fabricating a floating gate flash memory device in accordance with the present invention follows with reference to FIGS. 2–8. FIGS. 2–7 illustrate, in cross-section, process steps for the fabrication of a tunnel dielectric layer and a modified ONO structure in accordance with the invention. FIG. 8 is a schematic flow diagram showing the steps of the present invention. The following description of the process refers to FIGS. 2–7 sequentially and with reference to FIG. 8 generally. In one embodiment, the present invention can be carried out in a cluster tool.

In the first step of the present invention, shown schematically in FIG. 8 as Step S801, a semiconductor substrate is provided. The semiconductor substrate may be any appropriately selected semiconductor substrate known in the art. In one embodiment, the semiconductor substrate is a bulk silicon substrate. In one embodiment, the semiconductor substrate is a silicon-on-insulator semiconductor substrate. In another embodiment, the semiconductor substrate is a p-doped silicon substrate. Suitable semiconductor substrates include, for example, bulk silicon semiconductor substrates, silicon-on-insulator (SOI) semiconductor substrates, silicon-on-sapphire (SOS) semiconductor substrates, and semiconductor substrates formed of other materials known in the art. The present invention is not limited to any particular type of semiconductor substrate.

Figure 2:
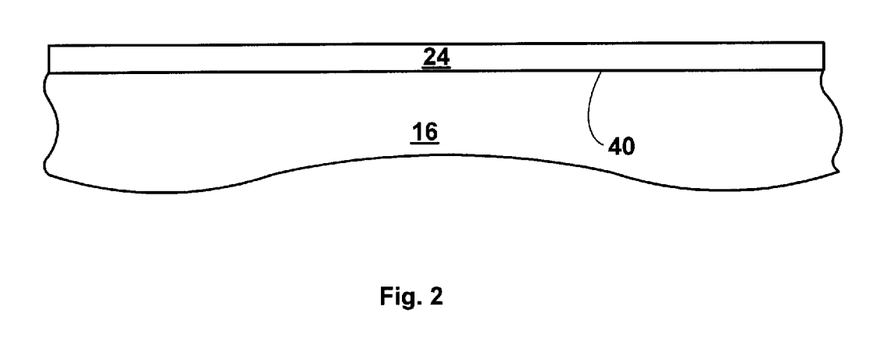
FIGS. 2–7 illustrate, in cross-section, process steps for the fabrication of a tunnel dielectric material layer and a modified ONO structure in accordance with the invention.

Referring to FIG. 2, in the second step of the present invention, shown schematically in FIG. 8 as Step S802, a tunnel dielectric material layer 24 is formed on an upper surface 40 of the semiconductor substrate 16.

In one embodiment, the upper surface 40 is processed to remove contaminants and native oxide, prior to formation of the tunnel dielectric material layer 24. A suitable pre-clean procedure includes cleaning the surface 40 with a dilute solution of hydrofluoric acid or any standard cleaning procedure used in the semiconductor industry.

The tunnel oxide layer 24 may be formed by any process and may comprise any high-K dielectric material known in the art. The method by which the layers comprising a high-K dielectric material and at least one of the bottom dielectric material layer 32 and the top dielectric material layer 36, are formed is described in detail below.

In one embodiment, the tunnel dielectric material layer 24 comprises both a high-K dielectric material and a standard-K dielectric material. In one embodiment, the tunnel dielectric material layer 24 comprises a high-K dielectric material. In one embodiment, the tunnel dielectric material layer 24 comprises a composite dielectric material, which comprises a mixture or composite of the elements of, or a reaction product of, two or more dielectric materials, at least one of which is a high-K dielectric material. In one embodiment, the tunnel dielectric material layer 24 comprises a composite of a high-K dielectric material and a standard-K dielectric material. Thus, in one embodiment, the high-K dielectric material completely replaces the silicon dioxide tunnel oxide layer of a conventional floating gate flash memory device. In another embodiment, the high-K dielectric material is, in essence, added to or combined with, the silicon dioxide tunnel oxide layer of a floating gate flash memory device to form the tunnel dielectric material layer 24 of the floating gate flash memory device 10. In another embodiment, the tunnel dielectric material layer 24 includes a composite dielectric material comprising elements of at least two high-K dielectric materials, which replaces the silicon dioxide of the tunnel oxide of a conventional floating gate flash memory device.

Figure 3:
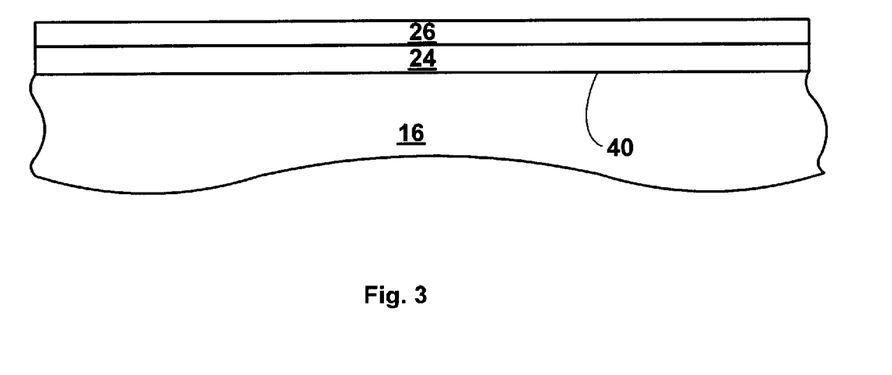

Referring to FIG. 3, in the third step of the present invention, shown schematically in FIG. 8 as Step S803, a floating gate electrode layer 26 is deposited over the tunnel dielectric material layer 24. The floating gate electrode layer 26 may be formed by any appropriate method known in the art. For example, the floating gate electrode layer 26 may be formed by a CVD process such as LPCVD, PECVD, RTCVD, ALCVD or MOCVD. The present invention is not limited to any particular method of forming the floating gate electrode layer 26.

Figure 4:
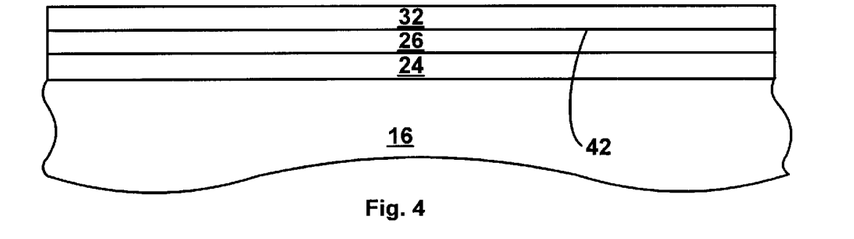

Referring to FIG. 4, in the fourth step of the present invention, shown schematically in FIG. 8 as Step S804, a bottom dielectric material layer 32 is formed on an upper surface 42 of the floating gate electrode layer 26. In one embodiment, the bottom dielectric material layer comprises a high-K dielectric material. In one embodiment, the bottom dielectric material is silicon dioxide.

In one embodiment, the upper surface 42 is the upper surface of a polysilicon or polysilicon-germanium layer. In one embodiment, the upper surface 42 previously has been processed to remove contaminants and native oxide. A suitable pre-clean procedure includes cleaning the silicon surface 42 with a dilute solution of hydrofluoric acid or any standard cleaning procedure used in the semiconductor industry.

In one embodiment, a monolayer of an interfacial barrier layer is deposited on the upper silicon surface 42 prior to formation of the bottom dielectric material layer 32, when the bottom dielectric material layer 32 comprises a high-K dielectric material. Suitable interfacial barrier layers are described above. In another embodiment, the high-K dielectric material of the bottom dielectric material layer 32 is deposited directly on the upper silicon surface 42, and any silicon dioxide formed by oxidation of the silicon combines with the high-K dielectric material to become a component of a composite dielectric material.

In an embodiment in which the bottom dielectric material layer 32 is silicon dioxide, the deposition procedure is conventional, and is not further described herein.

The bottom dielectric material layer 32 may be formed by any process and from any high-K dielectric material known in the art. The method by which the bottom dielectric material layer 32 is formed is described in detail below, together with the description of the formation of the tunnel dielectric material layer 24 and the top dielectric material layer 36.

In one embodiment, the bottom dielectric material layer 32 comprises both a high-K dielectric material and a standard-K dielectric material. In one embodiment, the bottom dielectric material layer 32 comprises a high-K dielectric material. In one embodiment, the bottom dielectric material layer 32 comprises a composite dielectric material, which comprises a mixture or composite of the elements of, or a reaction product of, two or more dielectric materials, at least one of which is a high-K dielectric material. In one embodiment, the bottom dielectric material layer 32 comprises a composite of a high-K dielectric material and a standard-K dielectric material. Thus, in one embodiment, the high-K dielectric material completely replaces the silicon dioxide bottom oxide layer of a conventional ONO structure. In another embodiment, the high-K dielectric material is, in essence, added to or combined with, the silicon dioxide bottom oxide layer of a conventional ONO structure to form the bottom dielectric material layer 32 of the modified ONO structure 30. In another embodiment, the bottom dielectric material layer 32 includes a composite dielectric material comprising elements of at least two high-K dielectric materials, which replaces the silicon dioxide of the bottom oxide of a conventional ONO structure.

Figure 5:
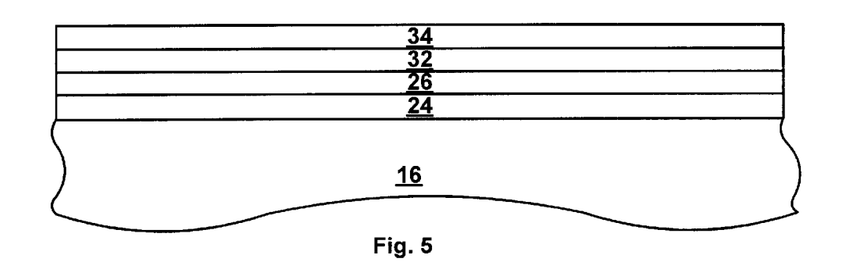

In the fifth step of the present invention, shown schematically in FIG. 8 as Step S805, a nitride layer 34 is formed on the bottom dielectric material layer 32. As shown in FIG. 5, after forming the bottom dielectric material layer 32, the nitride layer 34 is deposited on the layer 32. The nitride layer 34 may be formed by any method known in the art, as appropriate to the device being fabricated.

In one embodiment, the nitride layer 34 is silicon nitride. In another embodiment, the nitride layer 34 is silicon-rich silicon nitride. In other embodiments, the nitride layer 34 may be another suitable nitride, such as silicon oxynitride.

In one embodiment, the nitride layer 34 is formed by means of a rapid-thermal-chemical-vapor-deposition (RTCVD) process. In one embodiment, the RTCVD process is carried out at a temperature of about 700° C. to about 800° C. The silicon nitride material may be formed by reacting a suitable nitrogen-containing gas, e.g., ammonia ($NH_3$) with a suitable silicon-containing gas, e.g., dichlorosilane ($SiCl_2H_2$) or silane ($SiH_4$).

In one embodiment, the process of depositing the nitride layer 34 is carried out for a period of time and at gas flow rates sufficient to form a nitride layer having a thickness of about 50 to about 200 angstroms. In another embodiment, the process is carried out for a period of time and at gas flow rates sufficient to form a silicon nitride layer having a thickness of about 100 angstroms.

In one embodiment, in depositing the nitride layer 34, ammonia is introduced in the RTCVD apparatus at a flow rate of about 1 standard liter per minute (slpm) and either dichlorosilane or silane is introduced at a flow rate of about 30 to about 50 standard-cubic-centimeters-per-minute (sccm). The RTCVD process is carried out in three steps including an initial temperature ramp, a deposition step, and cool-down step. In one embodiment, the total reaction time is about 1–3 minutes. In another embodiment, the silicon nitride deposition step is completed in about 2 minutes.

In another embodiment, the nitride layer 34 may be formed by means of a low-pressure-chemical-vapor-deposition (LPCVD) process. In this alternative embodiment, the silicon nitride can be formed in a batch deposition apparatus. In one embodiment, the LPCVD process is carried out at an absolute pressure of about 200 to about 500 millitorr (mtorr), at temperatures of about 700–800° C. using ammonia and either dichlorosilane or silane gas.

In the sixth step of the present invention, shown schematically in FIG. 8 as Step S806, a top dielectric material layer 36 is formed on the nitride layer 34. In one embodiment, the top dielectric material layer 36 is a high-K dielectric material. In another embodiment, the top dielectric material layer 36 is silicon dioxide. In another embodiment, the top dielectric material layer 36 comprises a high-K dielectric material. As shown in FIG. 6, after depositing the nitride layer 34, the top dielectric material layer 36 is formed.

The top dielectric material layer 36 may be formed by any process and from any high-K dielectric material known in the art. The method by which the top dielectric material layer 36 is formed is described in detail below, together with the description of the formation of the tunnel dielectric material layer 24 and the bottom dielectric material layer 32.

In an embodiment in which the top dielectric material layer 36 is silicon dioxide, the deposition procedure is conventional, and is not further described herein.

In one embodiment, the top dielectric material layer 36 comprises both a high-K dielectric material and a standard-K dielectric material. In one embodiment, the top dielectric material layer 36 comprises a high-K dielectric material. In one embodiment, the top dielectric material layer 36 comprises a composite dielectric material, which comprises a mixture or composite of elements of, or a reaction product of, two or more dielectric materials, at least one of which is a high-K dielectric material. In one embodiment, the composite dielectric material of which the top dielectric material layer 32 is a composite of a high-K dielectric material and a standard-K dielectric material. Thus, in one embodiment, the high-K dielectric material completely replaces the silicon dioxide top oxide layer of a conventional ONO structure. In another embodiment, the high-K dielectric material is, in essence, added to or combined with, the silicon dioxide top oxide layer of an ONO structure to form the top dielectric material layer 36 of the modified ONO structure 30 of the present invention. In another embodiment, the top dielectric material layer 36 includes a composite dielectric material comprising elements of at least two high-K dielectric materials, which replaces the silicon dioxide layer of a conventional ONO structure.

High-K Materials and Deposition Methods

The following is a detailed description of methods by which the dielectric material layers comprising a high-K dielectric material may be formed. The following description applies equally to each of the tunnel dielectric material layer 24, the bottom dielectric material layer 32 and the top dielectric material layer 36, in embodiments in which the respective layer comprises a high-K dielectric material. As noted above, in embodiments in which either the top dielectric material layer 36 or the bottom dielectric material layer 32 is silicon dioxide, the method of formation is conventional, and is not described for sake of brevity. Each of these layers have been described above. The materials used and the methods by which each of these three layers are formed may be the same or different. That is, the material and method of formation of each of the three high-K or composite dielectric material layers is independent of the material and method selected for formation of the other high-K or composite dielectric material layers.

Formation of each of the dielectric material layers may include a growth process, e.g., oxidation of a silicon, polysilicon or polysilicon-germanium surface if the substrate over which the dielectric material is to be formed is one of these materials, or may be entirely by a deposition process.

In one embodiment, the dielectric material layer is formed by a deposition process. In one embodiment, a suitable high-K or composite dielectric material may be deposited by chemical vapor deposition (CVD). The CVD method may be any appropriate CVD method known in the art for deposition of a high-K material. In one embodiment, the high-K or composite dielectric material layer is formed by an ALCVD process. In one embodiment, the high-K or composite dielectric material layer is formed by an MOCVD process. In one embodiment, high-K or composite dielectric material layer is formed by an RTCVD process. In one embodiment, the RTCVD deposition is carried out in the same RTP apparatus as that in which the other steps of the process of the present invention are carried out. In one embodiment, the RTP apparatus is part of a single-wafer cluster tool. In one embodiment, the RTCVD process is carried out at a temperature of about 700° C. to about 800° C.

The high-K or composite dielectric material layer can also be formed by depositing the high-K or composite dielectric material layer in a batch furnace by an LPCVD process. In other embodiments, the CVD method may be PECVD or MLD.

The high-K or composite dielectric material may be formed by reacting a suitable metal-containing gas, e.g., hafnium tetra-t-butoxide with a suitable oxygen-containing gas, e.g., oxygen ($O_2$) or nitrous oxide ($N_2O$) in, e.g., the CVD apparatus.

In an embodiment in which the CVD is a RTCVD, the RTCVD high-K or composite dielectric material deposition may be carried out in three steps including an initial temperature ramp, a deposition step, and cool-down step. In one embodiment, the total reaction time is about 1–3 minutes. In another embodiment, the high-K or composite dielectric material deposition step is completed in about 2 minutes.

In one embodiment, the high-K or composite dielectric material includes at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$). In addition to the foregoing high-K dielectrics, other high-K dielectric materials, for example, ferroelectric high-K dielectric materials such as lead lanthanum titanate, strontium bismuth tantalate, bismuth titanate and barium zirconium titanate may be suitably used in the present invention. Other high-K or composite dielectric materials known in the art, including, for example binary and ternary oxides having K values of about 10 or higher, also may be used in the present invention.

In one embodiment, the high-K material is other than tantalum oxide ($Ta_2O_5$). Tantalum oxide has been found, in some embodiments, to exhibit an undesirably high leakage current.

Thus, for example, in an embodiment in which hafnium oxide is the high-K dielectric material, the hafnium may be supplied to a suitable CVD apparatus in the form of a hafnium-containing vapor or gas such as hafnium tetra-t-butoxide, and the oxygen is supplied in gaseous form as oxygen, $O_2$ or nitrous oxide, $N_2O$. When a suitable thickness of hafnium oxide has been deposited, the flow of the hafnium-containing vapor or gas and oxygen-containing gas are stopped.

As noted above, in an embodiment in which a plurality of dielectric materials (standard-K, high-K or composite) are deposited, alternating sub-layers of each dielectric material may be deposited, or a composite dielectric material which comprises the plurality of dielectric materials may be deposited in a single step. Thus, a first dielectric material precursor may be provided either simultaneously with or sequentially with a second dielectric precursor material. Either the first or the second dielectric precursor material may be a standard-K dielectric precursor or a high-K dielectric precursor, or both may be high-K precursor materials. The process of alternating sub-layer deposition may be continued until a suitable, selected number of sub-layers of desired composition and thickness has been deposited.

In one embodiment, a silicon containing gas, such as $SiH_4$, and a source of oxygen, may be provided together with or alternating with the high-K precursor vapor, during the step of forming the high-K dielectric material sub-layers, in an embodiment in which a composite dielectric material comprising both a high-K dielectric material and a standard-K dielectric material is to be produced. The composite dielectric material may be a mid-K dielectric material.

In one embodiment, a nitrogen-containing gas, such as ammonia ($NH_3$) may be provided along with the silicon-containing gas, oxygen-containing gas and high-K precursor.

In one embodiment, the process is carried out for a period of time and at gas flow rates sufficient to form a high-K or composite dielectric material-comprising layer having a thickness of about 25 to about 300 angstroms (Å). In another embodiment, the process is carried out for a period of time and at gas flow rates sufficient to form a high-K or composite dielectric material-comprising layer having a thickness of about 50 to about 200 Å.

In one embodiment, a high-K dielectric material precursor is introduced in the CVD apparatus at a flow rate of about 1 standard liter per minute (slpm) and either oxygen or nitrous oxide is introduced at a flow rate of about 1 slpm. Suitable flow rates of any other gases or vapors provided to the CVD apparatus may be determined by those of skill in the art, based on the composition of the dielectric material layer 28 (and/or layer 32) which is desired.

In one embodiment, the CVD is ALCVD, atomic layer CVD. ALCVD may be used to deposit a dielectric material in layers as thin as a molecular monolayer, which may also be referred to as a nanolayer. Formation of such nanolayers allows formation of a nano-laminate structure of any selected dielectric materials. The nano-laminate structure provides for deposition of a plurality of different high-K dielectric materials as sub-layers or nano-layers. The sub-layers may be deposited with single dielectric materials or with a plurality of simultaneously formed dielectric materials. The nano-laminates may thus form a composite high-K dielectric material layer. In one embodiment, sequentially deposited, different dielectric materials may be annealed subsequently to form a composite dielectric material which comprises the elements of the sequentially deposited, different dielectric materials. The conditions of deposition may be suitably selected to provide a nano-laminate or composite high-K dielectric material layer having a controlled physical thickness, composition and K value.

Thus, for example, ALCVD may be used to deposit alternating monolayers of hafnium oxide and silicon dioxide, in a partial replacement of the top silicon dioxide of a conventional ONO structure with a high-K dielectric material. The alternating layers may be retained, or the structure may be annealed to cause reaction or combination of the elements to form a composite dielectric material which would include the elements Hf/Si/O, i.e., $HfSiO_4$, hafnium silicate. Depending on the relative amounts of hafnium oxide and silicon dioxide deposited, the composite dielectric material may have a formula which varies from the above stoichiometry. Of course, it will be recognized that while the composite material includes the elements of the individual dielectric materials deposited, the exact stoichiometry may vary widely from this example.

As another example, a plurality of high-K dielectric materials may be deposited as a composite dielectric material layer to replace the silicon dioxide layers of the conventional floating gate flash memory device in forming the floating gate flash memory device of the present invention. The plurality of high-K dielectric materials may be deposited either simultaneously or in sequentially deposited sub-layers of selected thickness. A combination or composite of high-K dielectric materials may be selected in order to obtain a desired characteristic such as K value, physical thickness, equivalent oxide thickness, or a selected combination of these or other features. The use of ALCVD, with its capability of depositing a molecular monolayer of selected dielectric materials provides a wide range of possible structures for the modified ONO structure.

In another embodiment, the high-K or composite dielectric material layer may be formed by means of a low-pressure-chemical-vapor-deposition (LPCVD) process. In this alternative embodiment, the high-K or composite dielectric material can be formed in a batch deposition apparatus. In one embodiment, the LPCVD process is carried out at an absolute pressure of about 200 to about 500 millitorr (mtorr), at temperatures of about 700–800° C. using a high-K dielectric material precursor and either oxygen or nitrous oxide.

Suitable dielectric precursor materials are known in the art. For example, for hafnium oxide, hafnium tetra-t-butoxide has been mentioned above. For zirconium oxide, a suitable precursor is zirconium tetra-t-butoxide.

In one embodiment, the respective high-K or composite dielectric material layers have a thickness in the range from about 20 to about 300 angstroms (Å), and in another embodiment, the respective high-K or composite dielectric material layers have a thickness in the range from about 50 to about 200 Å.

As noted, the foregoing description of the deposition of the high-K or composite dielectric material layer applies to the tunnel dielectric material layer 24 and, in appropriate embodiments, to formation of the bottom dielectric material layer 32 and the top dielectric material layer 36.

In one embodiment, an important feature of the invention includes the sequential formation of the nitride layer 34 and the top dielectric material layer 36 in the absence of exposure of the nitride layer 34 to ambient atmosphere. Following the deposition of the nitride layer 34 onto the bottom dielectric material layer 32, the top dielectric material layer 36, in one embodiment comprising a high-K or composite dielectric material, may be formed, e.g., by RTCVD, MOCVD or ALCVD in a single wafer cluster tool, without the need for being transferred to a separate oxide deposition chamber, which would entail either maintenance of vacuum conditions without exposing the substrate to ambient atmosphere, or application of a positive-pressure inert gas atmosphere during wafer transfer. Thus, the present invention provides distinct process and economic advantages in formation of a modified ONO structure.

As shown in FIG. 7, following formation of the modified ONO structure 30 in accordance with the present invention, in the seventh step of the method of the present invention, shown schematically in FIG. 8 as Step S807, a layer forming a control gate electrode 28 is formed on the top dielectric material layer 36. The stacked-gate structure shown in FIG. 1 is completed by depositing the layer of control gate electrode-forming material overlying the top dielectric material layer 36. A lithographic patterning and etching process then may be carried out to define the control gate electrode 28 and the modified ONO structure 30. Those skilled in the art will recognize that various gate-forming materials can be used to fabricate the control gate electrode 28. For example, the control gate electrode 28 may be formed with polycrystalline silicon, polysilicon-germanium, amorphous silicon, a refractory metal silicide, a metal, and the like.

Following formation of the control gate electrode 28 and the modified ONO structure 30, fabrication of the floating gate flash memory device continues, as indicated in the final step of FIG. 8.

For example, fabrication of the floating gate flash memory device may include annealing the device in order to densify the silicon dioxide and/or high-K or composite dielectric material layers and/or to further form the composite dielectric material of any or all of the tunnel dielectric material layer 24, the bottom dielectric material layer 32 and the top dielectric material layer 36, in which the dielectric material layer comprises a high-K dielectric material.

In one embodiment, a monolayer of an interfacial barrier layer is deposited on the upper silicon surface 40 prior to formation of the tunnel dielectric material layer 24. The interfacial barrier layer may be any suitable material such as silicon nitride or silicon oxynitride, as disclosed in commonly assigned, copending U.S. patent application Ser. No. 10/189,643, filed Jul. 3, 2002 (entitled METHOD OF INTERPOLY HIGH-K DIELECTRIC INTEGRATION TO MINIMIZE LEAKAGE AND FLOATING GATE CONTAMINATION), the disclosure of which is hereby incorporated by reference for its teachings relating to an interfacial barrier layer.

Figure 9:
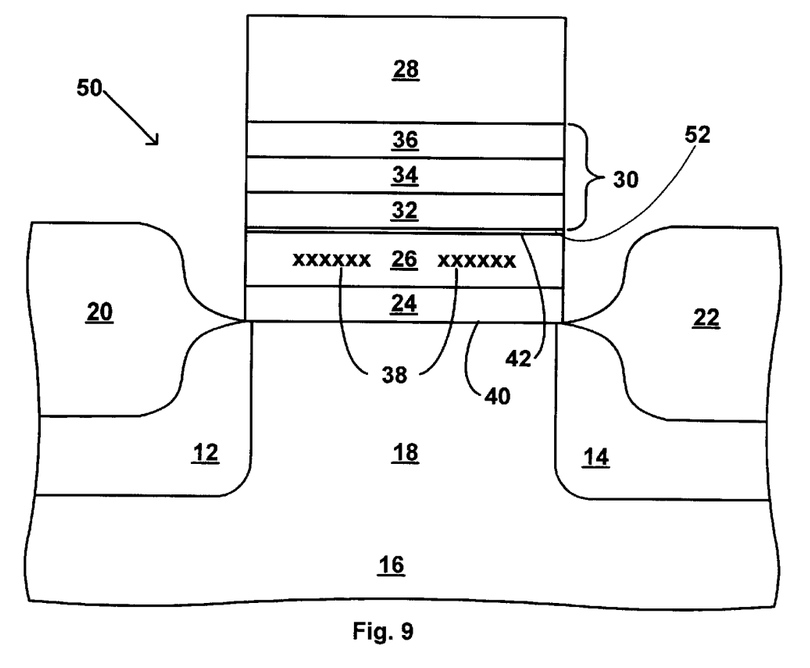
FIGS. 9 and 10 are schematic, cross-sectional views of alternate embodiments of the present invention, including an interfacial barrier layer.
Figure 10:
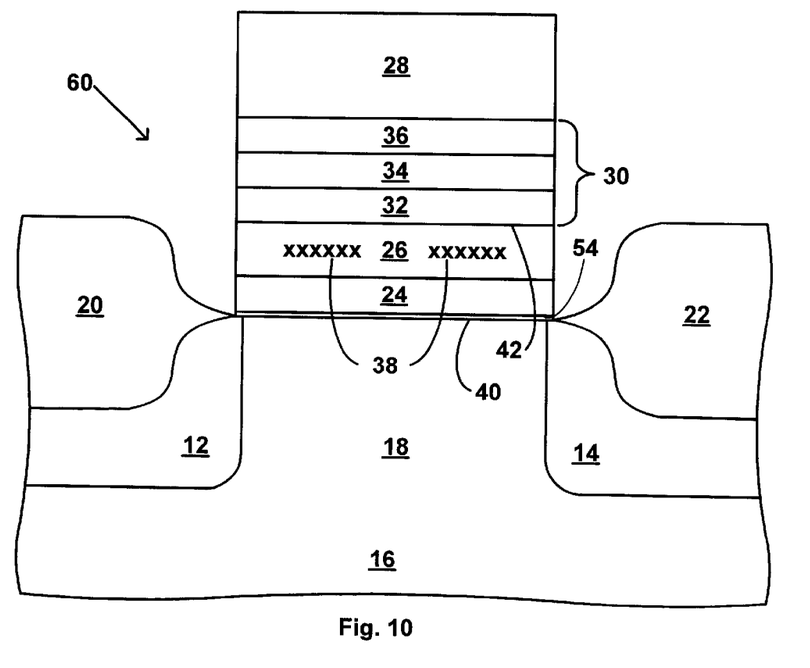

FIGS. 9 and 10 are schematic, cross-sectional views of two exemplary embodiments of the present invention, including an interfacial barrier layer. FIG. 9 shows a floating gate flash memory device 50 in accordance with the present invention, which includes all of the elements described above with respect to FIG. 1, and further includes an interfacial barrier layer 52 deposited on the upper surface 42 of the floating gate electrode 26.

FIG. 10 shows a floating gate flash memory device 60 in accordance with the present invention, which includes all of the elements described above with respect to FIG. 1, and further includes an interfacial barrier layer 54 deposited on the upper surface 40 of the semiconductor substrate 16.

In one embodiment, the interfacial barrier layer 52, 54 shown in FIGS. 9 and 10 comprises silicon nitride. In another embodiment, the interfacial barrier layer 52, 54 shown in FIGS. 9 and 10 comprises silicon oxynitride.

In one embodiment, the interfacial barrier layer 52, 54 shown in FIGS. 9 and 10 has a thickness in the range from a single monolayer to about 5 monolayers of the material of which it is formed, e.g., silicon nitride or silicon oxynitride.

In another embodiment, the high-K dielectric material of the tunnel dielectric material layer 24 is deposited directly on the upper silicon surface 40, and any silicon dioxide formed by oxidation of the silicon during the deposition combines with the high-K dielectric material to become a component of a composite dielectric material.

There has been disclosed in accordance with the invention a process for fabricating a floating gate flash memory device, which provides the advantages set forth above. As noted above, the process of the invention is also applicable to other semiconductor devices which include an ONO structure and another dielectric material layer.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the thicknesses of the individual dielectric material layers may be varied from that described herein. In another variation, an interfacial barrier layer may be added as appropriate. It is therefore intended to include within the invention all such variations and modifications that fall within the scope of the appended claims and equivalents thereof.

INDUSTRIAL APPLICABILITY

Thus, in accordance with the present invention, a floating gate flash memory device including a modified ONO structure and tunnel dielectric layer is provided which may be fabricated without creation of interface states that could provide charge leakage paths within the device. The present invention may provide advantages such as (1) improved coupling between the control gate electrode and the floating gate electrode; (2) reduction of equivalent oxide thickness of the ONO structure; (3) improved data retention and reliability; and (4) the high-K dielectric material layer replacing the silicon dioxide layers allows fabrication of an ONO layer and a tunnel dielectric layer which are physically thicker, resulting in fewer charge leakage paths within these dielectric material layers. The present invention includes an efficient process which may be carried out in a single device, such as a cluster tool. Thus, the present invention provides an advance in dielectric fabrication technology, and ensures proper dielectric separation of the control gate electrode from the floating gate electrode and proper dielectric separation of the gate stack from the underlying semiconductor substrate in a floating gate flash memory device, while at the same time providing distinct process and economic advantages. Although described in terms of, and particularly applicable to, floating gate flash memory devices, the present invention is broadly applicable to fabrication of any semiconductor device including an ONO structure and a dielectric material layer such as a tunnel dielectric layer.

What is claimed is:

1. A floating gate flash memory device comprising:

a) a substrate comprising a source region, a drain region, and a channel region positioned therebetween;

b) a floating gate electrode positioned above the channel region and separated from the channel region by a tunnel dielectric material layer, and c) a control gate electrode positioned above the floating gate electrode and separated from the floating gate electrode by an interpoly dielectric layer, the interpoly dielectric layer comprising a modified ONO structure having a bottom dielectric material layer adjacent to the floating gate electrode, a top dielectric material layer adjacent to the control gate electrode, and a center layer comprising a nitride and positioned between the bottom dielectric material layer and the top dielectric material layer, wherein the tunnel dielectric material layer comprises a first high-K dielectric material, and at least one of the bottom dielectric material layer and the top dielectric material layer, comprises an additional high-K dielectric material, and at least one of the tunnel dielectric material layer, the bottom dielectric material layer and the top dielectric material layer comprises a composite dielectric material including elements of the first or additional high-K dielectric material and at least one additional dielectric material.

2. The floating gate flash memory device of claim 1, wherein the first high-K dielectric material and the additional high-K dielectric material independently comprise at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$), lead lanthanum titanate, strontium bismuth tantalate, bismuth titanate and barium zirconium titanate.

3. The floating gate flash memory device of claim 1, wherein at least two of the tunnel dielectric material layer, the bottom dielectric material layer and the top dielectric material layer comprise a composite dielectric material including elements of the respective first or additional high-K dielectric material and at least one additional dielectric material.

4. The floating gate flash memory device of claim 1, wherein the floating gate electrode comprises at least one of polysilicon or polysilicon-germanium.

5. The floating gate flash memory device of claim 1, wherein the control gate electrode comprises at least one of polysilicon, polysilicon-germanium, a metal silicide or a metal.

6. The floating gate flash memory device of claim 1, wherein the layer comprising a nitride comprises silicon nitride or silicon-rich silicon nitride.

7. The floating gate flash memory device of claim 1, wherein both the bottom dielectric material layer comprises a second high-K dielectric material and the top dielectric material layer comprises a third high-K dielectric material.

8. A floating gate flash memory device comprising:
   a) a substrate comprising a source region, a drain region, and a channel region positioned therebetween;
   b) a floating gate electrode positioned above the channel region and separated from the channel region by a tunnel dielectric material layer; and
   c) a control gate electrode positioned above the floating gate electrode and separated from the floating gate electrode by an interpoly dielectric layer, the interpoly dielectric layer comprising a modified ONO structure having a bottom dielectric material layer adjacent to the floating gate electrode, a top dielectric material layer adjacent to the control gate electrode, and a center layer comprising a nitride and positioned between the bottom dielectric material layer and the top dielectric material layer,
   wherein the tunnel dielectric material layer, and at least one of the bottom dielectric material layer and the top dielectric material layer, comprise a high-K dielectric material,
   further comprising at least one interfacial barrier layer.

9. A floating gate flash memory device comprising:
   a) a substrate comprising a source region, a drain region, and a channel region positioned therebetween;
   b) a floating gate electrode positioned above the channel region and separated from the channel region by a tunnel dielectric material layer; and
   c) a control gate electrode positioned above the floating gate electrode and separated from the floating gate electrode by an interpoly dielectric layer, the interpoly dielectric layer comprising a modified ONO structure having a bottom dielectric material layer adjacent to the floating gate electrode, a top dielectric material layer adjacent to the control gate electrode, and a center layer comprising silicon nitride and positioned between the bottom dielectric material layer and the top dielectric material layer,
   wherein the tunnel dielectric material layer comprises a first high-K dielectric material, the bottom dielectric material layer comprises a second high-K dielectric material, and the top dielectric material layer comprises a third high-K dielectric material, wherein at least one of the tunnel dielectric material layer, the bottom dielectric material layer and the top dielectric material layer comprises a composite dielectric material including elements of the respective first, second or third high-K dielectric material and at least one additional dielectric material.

10. The floating gate flash memory device of claim 9, wherein each high-K dielectric material independently comprises at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$), lead lanthanum titanate, strontium bismuth tantalate, bismuth titanate and barium zirconium titanate.

11. The floating gate flash memory device of claim 9, wherein at least two of the tunnel dielectric material layer, the bottom dielectric material layer and the top dielectric material layer comprise a composite dielectric material including elements of the respective first, second or third high-K dielectric material and at least one additional dielectric material.

12. The floating gate flash memory device of claim 8, wherein the at least one interfacial barrier layer is on an upper surface of the floating gate electrode.

13. The floating gate flash memory device of claim 8, wherein the at least one interfacial barrier layer is on an upper surface of the semiconductor substrate.

14. The floating gate flash memory device of claim 1, wherein each of the tunnel dielectric material layer, the bottom dielectric material layer and the top dielectric material layer comprise a composite dielectric material including elements of the respective first or additional high-K dielectric material and at least one additional dielectric material.

15. The floating gate flash memory device of claim 9, further comprising at least one interfacial barrier layer.

16. The floating gate flash memory device of claim 15, wherein the at least one interfacial barrier layer is on an upper surface of the floating gate electrode.

17. The floating gate flash memory device of claim 15, wherein the at least one interfacial barrier layer is on an upper surface of the semiconductor substrate.

18. The floating gate flash memory device of claim 9, wherein each of the tunnel dielectric material layer, the bottom dielectric material layer and the top dielectric material layer comprise a composite dielectric material including elements of the respective first, second or third high-K dielectric material and at least one additional dielectric material.

19. A floating gate flash memory device comprising:
   a) a substrate comprising a source region, a drain region, and a channel region positioned therebetween;
   b) a floating gate electrode positioned above the channel region and separated from the channel region by a tunnel dielectric material layer, and
   c) a control gate electrode positioned above the floating gate electrode and separated from the floating gate electrode by an interpoly dielectric layer, the interpoly dielectric layer comprising a modified ONO structure having a bottom dielectric material layer adjacent to the floating gate electrode, a top dielectric material layer adjacent to the control gate electrode, and a center layer comprising silicon nitride and positioned between the bottom dielectric material layer and the top dielectric material layer,
   wherein each of the tunnel dielectric material layer, the bottom dielectric material layer and the top dielectric material layer comprises a high-K dielectric material, and at least two of the tunnel dielectric material layer, the bottom dielectric material layer and the top dielectric material layer comprise a composite dielectric material including elements of the high-K dielectric material and at least one additional dielectric material.

20. The floating gate flash memory device of claim 19, further comprising at least one interfacial barrier layer.

* * * * *